(12) United States Patent
Menezes

(10) Patent No.: US 9,741,430 B2
(45) Date of Patent: Aug. 22, 2017

(54) STATIC RANDOM ACCESS MEMORY WITH REDUCED WRITE POWER

(71) Applicant: TEXAS INSTRUMENTS INCORPORATED, Dallas, TX (US)

(72) Inventor: Vinod Menezes, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/284,890

(22) Filed: Oct. 4, 2016

(65) Prior Publication Data

US 2017/0025167 A1 Jan. 26, 2017

Related U.S. Application Data

(63) Continuation of application No. 14/847,380, filed on Sep. 8, 2015, now abandoned.

(30) Foreign Application Priority Data

Sep. 8, 2014 (IN) .......................... 4394/CHE/2014

(51) Int. Cl.
*G11C 11/412* (2006.01)
*G11C 11/419* (2006.01)
*G11C 11/418* (2006.01)
*G11C 7/12* (2006.01)

(52) U.S. Cl.
CPC .......... *G11C 11/419* (2013.01); *G11C 11/418* (2013.01); *G11C 7/12* (2013.01)

(58) Field of Classification Search
USPC ................................ 365/154, 203
See application file for complete search history.

(56) References Cited

U.S. PATENT DOCUMENTS

| | | | | |
|---|---|---|---|---|
| 2003/0185075 | A1* | 10/2003 | Park ................... | G11C 7/1072 365/203 |
| 2014/0036610 | A1* | 2/2014 | Ramamurthy .......... | G11C 7/12 365/203 |
| 2014/0185364 | A1* | 7/2014 | Iyer ........................ | G11C 8/16 365/154 |
| 2015/0029795 | A1* | 1/2015 | Kohli .................... | G11C 11/419 365/189.04 |

* cited by examiner

*Primary Examiner* — Hoai V Ho
*Assistant Examiner* — Minh Dinh
(74) *Attorney, Agent, or Firm* — John R. Pessetto; Charles A. Brill; Frank D. Cimino

(57) ABSTRACT

A static random access memory (SRAM) features reduced write cycle power consumption. The SRAM includes an array of static storage cells and a write controller. The array of static storage cells is accessible via a plurality of word lines and a plurality of bit lines, and is arranged to access multiple bits via each of the word lines. The write controller controls writing to the static storage cells. The write controller is configured to perform consecutive writes to a plurality of addresses associated with a same one of the word lines, and to, in conjunction with the consecutive writes, perform fewer precharges of the bit lines than consecutive writes.

3 Claims, 2 Drawing Sheets

STATIC RANDOM ACCESS MEMORY WITH REDUCED WRITE POWER

CROSS-REFERENCE TO RELATED APPLICATIONS

This application claims priority to U.S. patent application Ser. No. 14/847,380, filed Sep. 8, 2015, which claims priority to India Provisional Patent Application No. 4394/CHE/2014, filed Sep. 8, 2014, both applications are hereby incorporated herein by reference in their entirety.

BACKGROUND

Static random access memory (SRAM) is memory that utilizes latching to store each bit. Because SRAM is static, there is no need to periodically refresh the memory. SRAM is therefore, typically faster, less dense, and more expensive, than dynamic random-access memory (DRAM). Due to SRAM's speed, SRAM is often used in computer applications that require a fast memory such as cache memory for the central processing unit (CPU), external burst mode SRAM caches, hard disk buffers, router buffers, CPU register files, etc. While SRAM is fast, it may also consume a significant portion of system level dynamic power. In some cases SRAM may consume as much as 90% of the system level dynamic power.

SUMMARY

A static random access memory (SRAM) that provides reduced write cycle power consumption is disclosed herein. In one embodiment, a memory includes an array of static storage cells and a write controller. The array of static storage cells is accessible via a plurality of word lines and a plurality of bit lines, and is arranged to access multiple bits via each of the word lines. The write controller controls writing to the static storage cells. The write controller configured to perform consecutive writes to a plurality of addresses associated with a same one of the word lines, and, in conjunction with the consecutive writes, to perform fewer precharges of the bit lines than consecutive writes.

In another embodiment, an integrated circuit includes an SRAM. The SRAM includes an array of storage cells and a write controller. The array of storage cells is arranged as rows and columns, and includes word lines that correspond to the rows and bit lines that correspond to the columns. The write controller is to manage writing to the storage cells. The write controller is configured to identify consecutive writes to storage cells accessed via a same one of the word lines, and to precharge the bit lines on fewer than all of the consecutive writes.

In a further embodiment, an SRAM includes an array of storage cells and a write controller. The array of storage cells is arranged as rows and columns, and includes word lines that correspond to the rows and bit lines that correspond to the columns. The write controller is to manage writing to the storage cells. The write controller is configured to identify consecutive writes to storage cells accessed via a same one of the word lines, and to precharge the bit lines no more than once during the consecutive writes.

BRIEF DESCRIPTION OF THE DRAWINGS

For a detailed description of various examples, reference will now be made to the accompanying drawings in which.

NOTATION AND NOMENCLATURE

Figure 1:
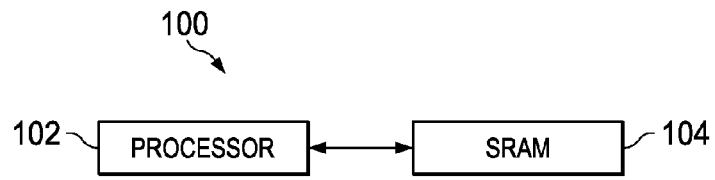
FIG. 1 shows a block diagram of an integrated circuit that includes static random access memory (SRAM) in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Static random access memory (SRAM) is a type of memory that utilizes transistors arranged as cross-coupled inverters to form latches that store each bit. An SRAM storage cell often includes four or six transistors. SRAM storage is volatile, and retains stored data only as long as power is applied to the circuit. In contrast to dynamic random access memory (DRAM), which may include only a single transistor per storage cell, SRAM does not need to be periodically refreshed. Accordingly, SRAM may be faster than DRAM, but also may be less dense, and more expensive than DRAM. Because SRAM provides low access times relative to other memory technologies, SRAM is often used in applications in which maximizing speed is an important consideration. For example, SRAM is typically used as central processing unit (CPU) cache memory, external burst mode caches, hard disk buffers, router buffers, CPU register files, etc. Consequently, SRAM is a fundamental building block of many systems. While SRAM is fast, it may consume a significant portion of a system's dynamic power. In some cases SRAM may consume as much as 90% of the system's dynamic power. Therefore, it is desirable to reduce the power consumption of SRAM.

In an SRAM, storage cells are accessed via a number of word lines and bit lines. Each word line may correspond to a range of addresses applied to access the SRAM, and each bit line may correspond to one address within the range of addresses. During each access of the SRAM, all storage cells connected to a word line may be activated to drive the bit lines connected to the cells. Thus, while access of only a single storage cell associated with the word line is needed, multiple storage cells are accessed. To prevent the contents of the storage cells from being modified by the access, conventional SRAMs precharge each bit line on every access (e.g., ever read cycle and every write cycle). That is, in conventional SRAMs, whenever a storage cell is to be written or read, a precharge of the bit lines is initiated. Once the bit lines are precharged in the conventional SRAM, the word line corresponding to the row in which the storage cell to be read is activated. If another storage cell is to be read, the process repeats beginning with a precharge of the bit lines. The repeated precharging of the bit lines creates a high level of power consumption.

The SRAM of the present disclosure reduces the power consumed during write cycles by selectively precharging the bit lines. Instead of precharging the bit lines on every write cycle, the SRAM disclosed herein may precharge the bit lines only once for multiple write cycles. In some implementations, the bit lines may be precharged only once for consecutive accesses that write to cells on a same word line. For example, if a linear burst write is performed in which a same row address is utilized (i.e., a same word line is activated) for writing to multiple consecutive addresses, the SRAM may perform only a single precharge for writing to the multiple addresses. In some embodiments, after a write of a first storage cell, a precharge may not be performed if the next storage cell to be written is on the same word line as the first storage cell. By eliminating a significant number of precharge cycles, embodiments of the SRAM disclosed herein substantially reduce write cycle power consumption.

FIG. 1 shows a block diagram of an integrated circuit 100 in accordance with various embodiments. The integrated circuit 100 may include a processor 102 and an SRAM 104. The SRAM 104 may be communicatively coupled to the processor 102. The integrated circuit 100 may also include various additional components, such as transceivers, clock generators, ports, etc. that have been omitted from FIG. 1 in the interest clarity. The processor 102 may be a control processor, a signal processor, a central processor, or any other type of processor. For example, the processor 102 may be, a general-purpose microprocessor, a digital signal processor, a microcontroller, or other suitable device configured to execute instructions for performing operations. Processor architectures generally include execution units (e.g., fixed point, floating point, integer, etc.), instruction decoding, peripherals (e.g., interrupt controllers, timers, direct memory access controllers, etc.), input/output systems (e.g., serial ports, parallel ports, etc.) and various other components and sub-systems.

The SRAM 104 is static random access memory that may provide storage of data and/or instructions that are accessed and processed by the processor 102. The SRAM 104 is an information storage device that utilizes latching circuitry (e.g., a flip-flop) to store each bit of data. The SRAM 104 is coupled to the processor 102 such that the processor 102 may read and/or write data and/or instructions from/to the SRAM 104. In some embodiments, the SRAM 104 is a part of or internal to the processor 102. In other embodiments, the SRAM 104 is distinct from or external to the processor 102. While a single instance of the SRAM 104 has been illustrated in FIG. 1 as a matter of convenience, in practice, any number of SRAMs 104 may be included in the integrated circuit 100.

Figure 2:
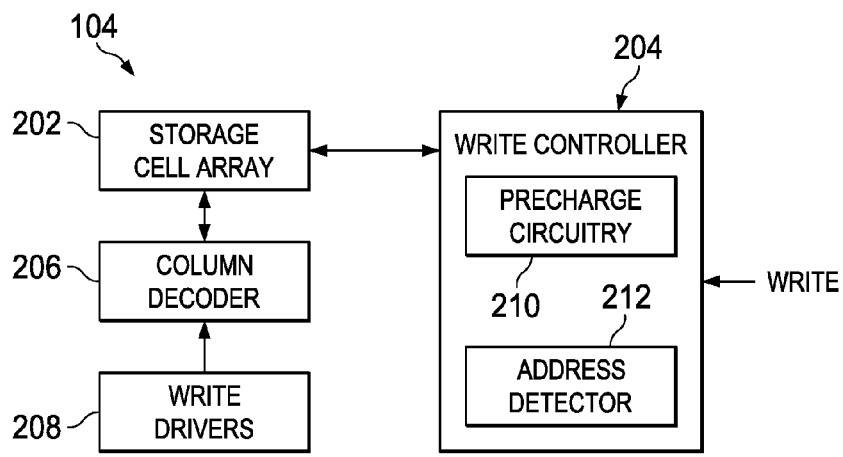
FIG. 2 shows a block diagram of an SRAM in accordance with various embodiments.

FIG. 2 shows a block diagram of the SRAM 104 in accordance with various embodiments. The SRAM 104 includes a storage cell array 202, a write controller 204, a column decoder 206, and write drivers 208. The storage cell array 202 may be arranged as rows and columns of storage cells, sometimes referred to as bit cells, each storage cell storing one bit of data.

Figure 3:
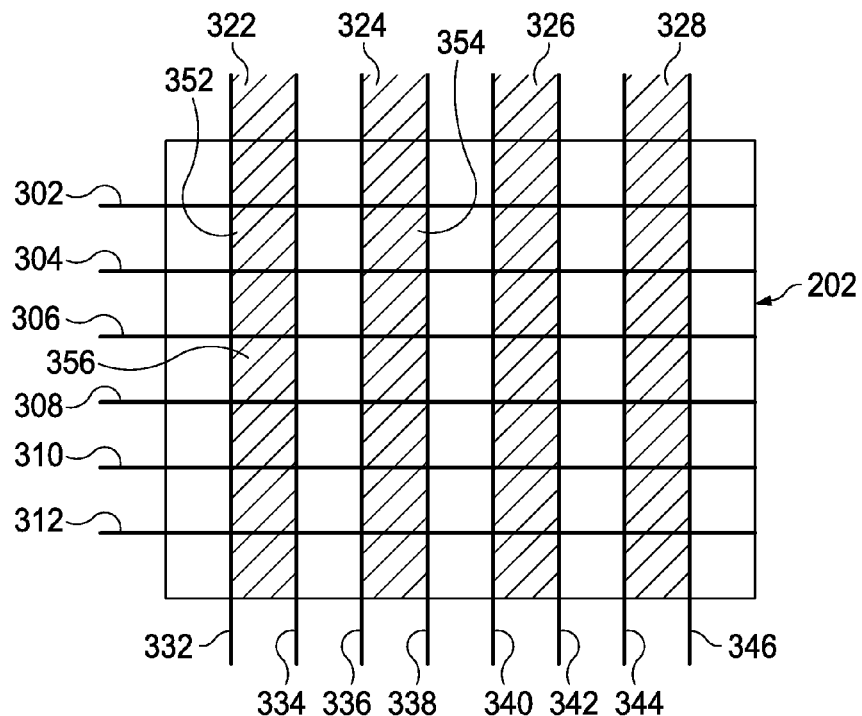
FIG. 3 shows a diagram of a storage cell array of an SRAM in accordance with various embodiments.

FIG. 3 shows a diagram of the storage cell array 202 in accordance with various embodiments. The storage cell array 202 includes word lines 302-312 and bit lines 332-346. The word lines 302-312 correspond to the rows of storage cell array 202. The bit lines 332-346 correspond to the columns 322-328 of the storage cell array 202. Each of the bit lines 332-346 may include signal lines arranged as a differential pair. For example, column 322 may be accessed via bit lines 332-334; column 324 may be accessed via bit lines 336-338; column 326 may be accessed via bit lines 340-342; and column 328 may be accessed via bit lines 344-346. At the intersection of each of the word lines 302-312 and the columns 322-328, are the storage cells, such as storage cells 352, 354 and 356, that make up storage cell array 202.

Each of the storage cells in storage array 202, such as storage cells 352, 354, and 356 may be arranged to store a single bit of data. In some embodiments, each of the storage cells is a six-transistor ("6T") SRAM cell that includes a pair of cross-coupled inverters that form a data storage latch. Each inverter may include a p-channel transistor and an n-channel transistor. The source of a first pass gate transistor is connected to the gate nodes of the first inverter and the drain nodes of the second inverter. Similarly, the source of a second pass gate transistor is connected to the gate nodes of the second inverter and the drain nodes of the first inverter. The gates of the pass gate transistors are connected to a common word line, such as word line 302 for storage cells 352 and 354 and word line 308 for storage cell 356, while the drains of the pass gate transistors are connected to a differential pair of bit lines, such as bit lines 332 and 334 for storage cells 352 and 356 and bit lines 336 and 338 for storage cell 354. In alternative embodiments, the storage cells of storage array 202 may be any type of SRAM bit cell, such as a four-transistor ("4T") SRAM cell, an eight-transistor ("8T") SRAM cell, a ten-transistor ("10T") SRAM cell, or any other SRAM storage cell.

Returning now to FIG. 2, the write controller 204 is coupled to the storage cell array 202 and manages writing of data to the storage cells contained in storage cell array 202. For example, during a write operation, the write controller 204 may generate signals that control the operation of the storage cells to change the value of data stored in the cells. The write controller 204 includes precharge circuitry 210 and address detector 212. The write controller 204 may be any type of memory controller that manages the flow of data going to storage cell array 202.

At the beginning of a write cycle, precharge circuitry 210 may cause each of the differential pairs of bit lines 332-346 (both positive and negative signals) to be charged to a common voltage (e.g., a voltage applied to power the transistors of the storage cells). In order to write any of the storage cells, the word line corresponding to the storage cell to be written is asserted. For example, if storage cell 352 is to be written, then word line 302 is asserted. In some embodiments, a row controller (not shown) may decode an address applied to the SRAM 104 and cause a word line corresponding to an address range that includes the address to be asserted. Once the word line is asserted, each of the pass gate transistors from each of the storage cells on the asserted word line is enabled. For example, if word line 302 is activated, then pass gate transistors in storage cells 352 and 354, as well as the pass gate transistors for any other storage cell connected to word line 302 are enabled. This causes the bit line voltage for one of the two signals of the bit line differential pair connected to each of the storage cells to drop based on whether the storage cell connected to the differential pair stores a 0 or a 1. For example, once word line 302 is asserted, the voltage along bit line 332 or 334 will drop based on whether storage cell 352 stores a 0 or a 1. Similarly, the voltage along bit line 336 or 338 will drop based on whether storage cell 354 contains a 0 or a 1.

The column decoder 206 determines which of the columns 322-328 of the SRAM 104 contains the storage cell that is to be written. More specifically, the column decoder 206 routes drive signals corresponding to data values to be written to a given address in the storage array 202 to the bit lines associated with the column(s) containing the addressed storage cells. The signal values routed by the column decoder 206 are driven by the write drivers 208, which are stronger than the transistors of the storage cell, and the data values propagated by the write drivers 208 are consequently forced onto the storage cells at the intersection of the asserted word line and the bit lines selected by the column decoder 206.

While the storage cells at the intersection of a selected bit line and an asserted word line are written to a value driven by the write drivers 208, other storage cells activated by assertion of the word line are not driven. As explained above, all storage cells activated by word line assertion attempt to drive the bit lines to which they are connected. Precharging the bit lines to a predetermined voltage protects the contents of the storage cells that are not to be written by ensuring that storage cells will not be exposed to low voltages on the bit lines that may inadvertently change a logic "1" stored in the cell to a logic "0," or vice versa. As further explained above, activation of a word line, during a write operation or a read operation, causes each activated storage cell to drive the bit line to which the cell is connected to the data value stored in the cell. The write controller 204 takes advantage of the bit line states produced by the unwritten storage cells to reduce the number of precharge cycles needed to insure that the unwritten storage cells are not disturbed during write cycles. After each write cycle, the bit lines reflect the values stored in the storage cells. Consequently, after, as a result of a previous write cycle, the bit lines have been driven to the data values stored in the cells, the bit lines cannot cause the values stored in the cells to change, and embodiments of the write controller 204 can refrain from executing precharge cycles.

The write controller 204 identifies consecutive writes to storage cells accessed via a same word line. For example, if a write to storage cell 352 is immediately followed by a write to storage cell 354, which is on the same word line, word line 302, as storage cell 352, then the write controller 204 makes this identification. Unlike a conventional SRAM, if the write controller 204 identifies consecutive writes to storage cells accessed via the same word line, then the bit lines 332-346 are not precharged between the two writes. Because activation of a specified word line causes unwritten storage cells to drive the bit lines connected to the unwritten storage to the value stored in the cells, no precharge is necessary on subsequent write cycles to preserve the contents of the unwritten storage cells activated by assertion of the word line. Therefore, the bit lines 332-346 may only be precharged once in conjunction with the consecutive writes. For example, in some embodiments, for a series of consecutive writes using a same word line, the bit lines may be precharged only once, prior to an initial write of a series of consecutive writes. In some embodiments, for a series of consecutive writes using a same word line, the bit lines may be precharged only once, subsequent to a final write of a series of consecutive writes (e.g., if the bit lines were precharged after a last access previous to the consecutive writes).

The write controller 204 may determine that the bit lines are to be precharged based on a number of different factors. For example, in some embodiments of the SRAM 104, a write signal 214 is received by the write controller 204. The write signal 214 may be provided by the processor 102, or other device that accesses the SRAM 104, in conjunction with address signals, data signals, and other control signals. In some embodiments, the write signal 214 may be asserted for as long write cycles to a same word line (e.g., a same row address) are being performed. Accordingly, the write controller 204 may precharge the bit lines 332-346 on assertion of the write signal 214 (i.e., prior to the first write executed after assertion of the write signal 214), and/or may precharge the bit lines 332-346 on negation of the write signal 214 (i.e., subsequent to the last write executed during assertion of the write signal 214).

The address detector 212 identifies changes in the row address applied in the SRAM 104. In other words, the address detector 212 determines if and when the SRAM 104 is requested to write a storage cell in storage array 202 that is not on the word line last written or last accessed. If the address detector 212 detects a row address change request, the write controller 204, utilizing precharge circuitry 210, causes each of the differential pairs of bit lines 332-346 to precharge, thereby enabling writing of storage cells on the different word line. For example, if storage cell 352 is being written, word line 302 is activated. However, if the address detector 212 detects a row address change request, such that storage cell 356 is to be written, then word line 306 needs to be activated. Because word line 306 is a different word line (on a different row) than word line 302, precharge circuitry 210 causes the differential pairs of bit lines 332-346 to precharge. Thus, write controller 204 may include circuitry (e.g., a register) that stores an indication of which word line was last asserted (in this example word line 302), and circuitry that compares the indication of which word line was last asserted to an indication of a word line currently, or that will be, asserted. Based on the word line currently being asserted or that will be asserted (word line 306 in this example) being different than the word line last asserted (word line 302), precharge circuitry 210 precharges the bit lines 332-346.

The write controller 204 may also initiate precharging based on time. After a period of time has elapsed since access of storage cells using a given word line, the bit lines 332-346 may discharge to the point that the storage cells may be disturbed if the bit lines are not precharged prior to a write operation. For example, prior to a write cycle, bit lines 332-346 may be precharged and a word line activated, such as word line 302. After a period of time, if the bit lines are not precharged again, the bit lines 332-346 may discharge such that the contents of the storage cells may be disturbed if another write cycle using word line 302 is performed without first precharging the bit lines 332-346. Therefore, write controller 204 may measure the amount of time that has elapsed since assertion of a word line, and if the elapsed time is greater than a threshold value, initiate precharging of the bit lines 332-346. In other words, based on a determination that an amount of time exceeding a threshold amount has elapsed since an immediately previous access to the storage cells has occurred, the write controller 204 may precharge the bit lines. Similarly, in some embodiments, based on a determination that an amount of time exceeding a threshold amount has elapsed since the bit lines were precharged or the storage cells or accessed, the write controller 204 may precharge the bit lines. The threshold amount of time may be based on the amount of time it takes to discharge the bit lines 332-346. Thus, SRAM 104 may include a built-in safe guard to ensure that the storage cells in storage array 202 are always accessible. By precharging the bit lines 332-346 in storage array 202 only before and/or after consecutive writes via the same word line, or after a predetermined threshold amount of elapsed time since an access, SRAM 104 can provide greatly reduced power consumption, relative to a conventional SRAM, without any reduction in performance.

Figure 4:
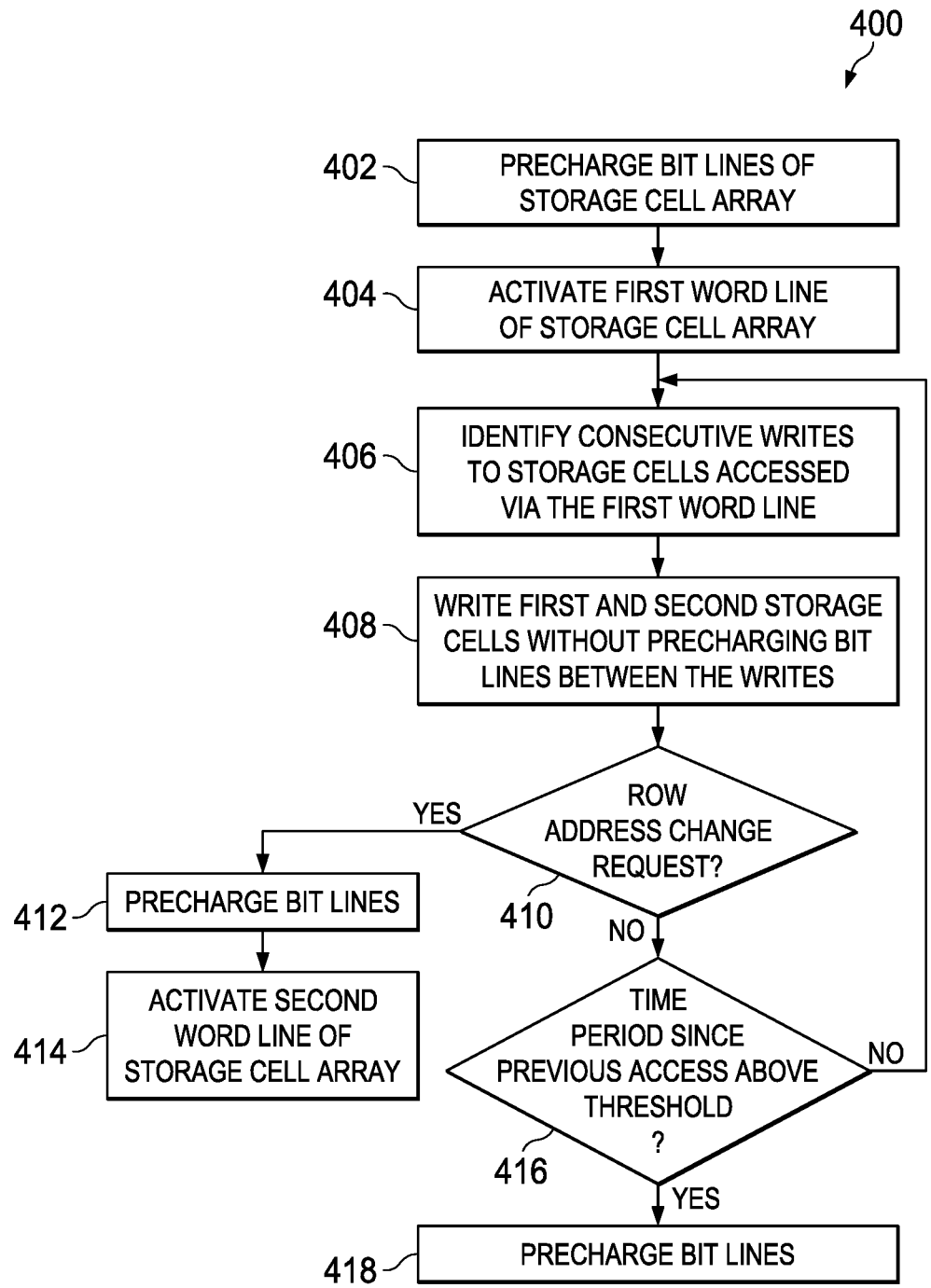
FIG. 4 shows a flow diagram of a method for reducing write cycle power consumption in a SRAM in accordance with various embodiments.

FIG. 4 shows a flow diagram for a method 400 for reducing power consumption of SRAM write operations in accordance with various embodiments. Though depicted sequentially as a matter of convenience, at least some of the actions shown in the method 400 can be performed in a different order and/or performed in parallel. Additionally, some embodiments may perform only some of the actions shown or may perform additional actions. In some embodiments, at least some of the operations of the method 400, as well as other operations described herein, can be performed by the SRAM 104 and/or the write controller 204 disclosed herein.

The method 400 begins in block 402 with precharging bit lines of a storage cell array, such as bit lines 332-346 of storage cell array 202. The precharging sets all of the bit lines to a predetermined voltage value. For example, the precharging may charge all of the bit lines to a value of voltage applied to power the transistors of the storage cells of the SRAM 104.

In block 404, the method 400 continues with activation of a first word line of the storage cell array. For example, word line 302 may be activated so as to write the contents of a storage cell on word line 302, such as storage cell 352. By activating the word line, a differential is created between each of a plurality of differential pairs of bit lines that make up a column in the storage cell array. A column decoder, such as column decoder 206, then may select which of the bits lines is to be driven to a data value provided to the SRAM 104 for writing into the storage cells.

The method 400 continues in block 406 with identifying, in some embodiments by the write controller 204, consecutive writes to storage cells accessed via the first word line. For example, the write controller 204 may determine whether storage cell 354, which is accessed via word line 302, is being written consecutively after storage cell 352, which is also accessed via word line 302.

In block 408, the method 400 continues with writing a first and second storage cell without precharging bit lines between the writes. Continuing the previous example, after the write driver 208 drives differential bit lines 332 and 334 via the column decoder 206, and first write data is written to the storage cell 352, the write driver 208 drives differential bit lines 336 and 338 via the column decoder 206, and second write data is written to the storage cell 354 without precharging the bit lines 332-346 between the writes.

The method 400 continues in block 410 with a determination of whether a row address change request has been made. This determination may be made by address detector 212 within write controller 204. The address detector 212 may compare an indication of which word line was last asserted to an indication of a word line currently, or to be, asserted. Based on a determination in block 410 that a row address change request has been made, in block 412, the method 400 continues with precharging the bit lines, such as bit lines 332-346. In block 414, the method 400 continues with asserting a second word line of the storage cell array.

However, if, in block 410, a determination is made that a row address change request has not been made, then the method 400 continues in block 416 with determining whether the time period since an immediately previous write is above a threshold value. This determination may be made by read controller 204. If in block 416 a determination is made that the time period since the immediately previous write is not above the threshold value, then the method 400 continues in block 406 with identifying consecutive writes to the storage cells accessed via the same word line as the immediately previous write. However, if in block 416 a determination is made that the time period since the immediately previous write is above the threshold value, then the method 400 continues in block 418 with precharging the bit lines, such as bit lines 332-346.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A memory, comprising:
an array of static storage cells accessible via a plurality of word lines and a plurality of bit lines, and arranged to access multiple bits via each of the word lines;
a write controller that controls writing to the static storage cells, the write controller configured to:
perform consecutive writes to a plurality of addresses associated with a same one of the word lines; and in conjunction with the consecutive writes, perform fewer precharges of the bit lines than consecutive writes;
wherein the write controller is configured to perform a precharge of the bit lines based on time since a last access of the storage cells via the same one of the word lines exceeding a predetermined time.

2. An integrated circuit, comprising:
a static random access memory (SRAM), comprising:
an array of storage cells arranged as rows and columns, and comprising word lines that correspond to the rows and bit lines that correspond to the columns; and
a write controller to manage writing to the storage cells, the write controller configured to:
identify consecutive writes to storage cells accessed via a same one of the word lines; and
precharge the bit lines on fewer than all of the consecutive writes;
wherein the write controller is configured to perform a precharge of the bit lines based on time since a last access of the storage cells via the same one of the word lines exceeding a predetermined time.

3. A static random access memory (SRAM), comprising:
an array of storage cells arranged as rows and columns, and comprising word lines that correspond to the rows and bit lines that correspond to the columns; and a write controller to manage writing to the storage cells, the write controller configured to:
identify consecutive writes to storage cells accessed via a same one of the word lines; and
precharge the bit lines no more than once during the consecutive writes;
wherein the write controller is configured to perform a precharge of the bit lines based on time since a last access of the storage cells via the same one of the word lines exceeding a predetermined time.

* * * * *